(12) United States Patent
Yoshida (10) Patent No.: US 9,741,650 B2
(45) Date of Patent: Aug. 22, 2017

(54) WIRING BOARD AND SEMICONDUCTOR PACKAGE

(71) Applicant: SHINKO ELECTRIC INDUSTRIES CO., LTD., Nagano (JP)

(72) Inventor: Tatsuro Yoshida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 6 days.

(21) Appl. No.: 14/986,844

(22) Filed: Jan. 4, 2016

(65) Prior Publication Data

US 2016/0240467 A1 Aug. 18, 2016

(30) Foreign Application Priority Data

Feb. 18, 2015 (JP) ................. 2015-029962

(51) Int. Cl.
*H01L 23/498* (2006.01)
(52) U.S. Cl.
CPC .. *H01L 23/49838* (2013.01); *H01L 23/49811* (2013.01); *H01L 23/49816* (2013.01); *H01L 23/49822* (2013.01); *H01L 23/49827* (2013.01); *H01L 2224/16225* (2013.01)

(58) Field of Classification Search
CPC ..... H01L 2224/16225; H01L 23/49811; H01L 23/49816; H01L 23/49822; H01L 23/49827; H01L 23/29838
See application file for complete search history.

(56) References Cited

U.S. PATENT DOCUMENTS

2011/0297425 A1* 12/2011 Nakamura ............ H01L 21/486
174/251
2013/0284499 A1* 10/2013 Imafuji .................... H05K 3/00
174/250

FOREIGN PATENT DOCUMENTS

JP          2002-290022       10/2002

* cited by examiner

*Primary Examiner* — Whitney T Moore
*Assistant Examiner* — Joseph Galvin, III
(74) *Attorney, Agent, or Firm* — IPUSA, PLLC (57) ABSTRACT

A wiring board includes a wiring layer including a surface on which a recess is formed and a metal layer formed on a bottom surface of the recess. A surface of the metal layer facing away from the bottom surface of the recess is closer to the bottom surface of the recess than is the surface of the wiring layer.

11 Claims, 6 Drawing Sheets

WIRING BOARD AND SEMICONDUCTOR PACKAGE

CROSS-REFERENCE TO RELATED APPLICATION

This application is based upon and claims the benefit of priority of the prior Japanese Patent Application No. 2015-029962, filed on Feb. 18, 2015, the entire contents of which are incorporated herein by reference.

FIELD

A certain aspect of the embodiments discussed herein is related to a wiring board and a semiconductor package.

BACKGROUND

A wiring board has been known that includes an insulating layer covering a wiring layer, where an opening is formed in the insulating layer to expose part of the wiring layer and a metal layer of nickel or the like is formed on the exposed part of the wiring layer in the opening.

A semiconductor chip is mounted on such a wiring board, so that a semiconductor package is formed. In this case, solder is provided on an upper surface of the metal layer exposed inside the opening of the wiring board, so that the upper surface of the metal layer and an electrode pad of the semiconductor chip are joined with the solder. (See, for example, Japanese Laid-Open Patent Publication No. 2002-290022.)

SUMMARY

According to an aspect of the invention, a wiring board includes a wiring layer including a surface on which a recess is formed and a metal layer formed on a bottom surface of the recess. A surface of the metal layer facing away from the bottom surface of the recess is closer to the bottom surface of the recess than is the surface of the wiring layer.

It is to be understood that both the foregoing general description and the following detailed description are exemplary and explanatory and not restrictive of the invention.

DESCRIPTION OF EMBODIMENTS

In the case of mounting a semiconductor chip on the wiring board as described above, the wiring board may be composed mainly of resin and the semiconductor chip may be composed mainly of silicon. In such a case, a crack may be generated in the insulating layer, starting at the interface between the metal layer and the solder, because of a large difference in the coefficient of thermal expansion between the wiring board and the semiconductor chip. If this crack laterally extends in the insulating layer, the insulating layer is removed or the solder enters the crack to cause a short circuit in the wiring layer, thus decreasing the reliability of the wiring board.

According to an aspect of the invention, a wiring board capable of reducing a decrease in reliability due to a crack generated in an insulating layer is provided.

Preferred embodiments of the present invention will be explained with reference to accompanying drawings. In the drawings, the same elements are referred to by the same reference numeral, and a repetitive description thereof may be omitted.

[a] First Embodiment

Figure 1A:
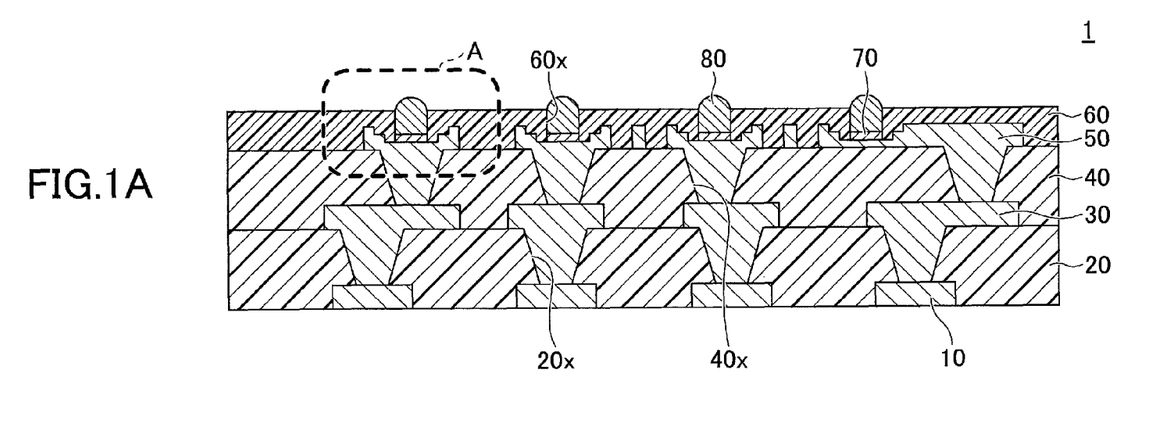
FIGS. 1A and 1B are cross-sectional views of a wiring board according to a first embodiment.
Figure 1B:
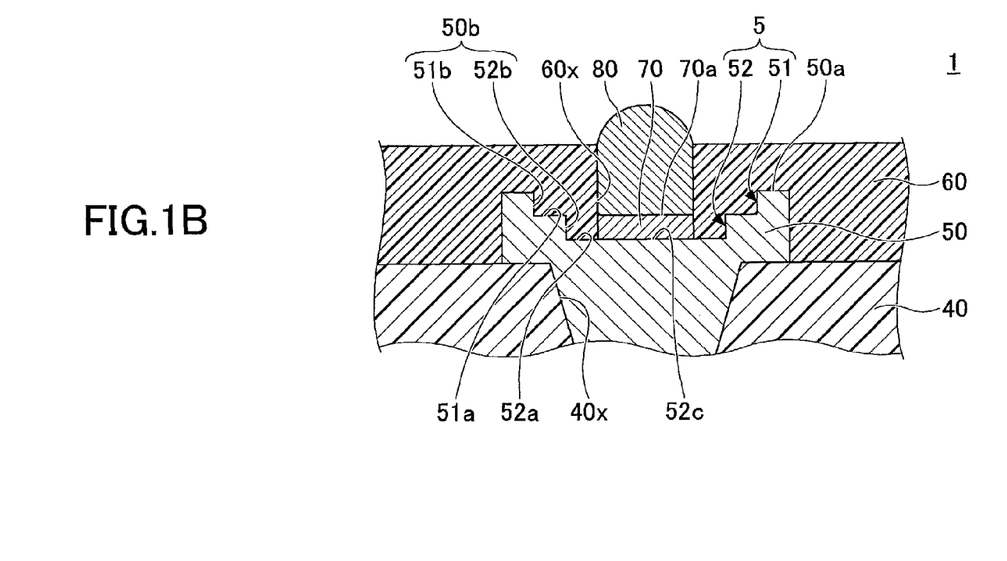

A description is given first of a structure of a wiring board according to a first embodiment. FIGS. 1A and 1B are cross-sectional views of a wiring board according to the first embodiment. FIG. 1B is an enlarged view of part of FIG. 1A indicated by A.

Referring to FIGS. 1A and 1B, a wiring board 1 according to the first embodiment is a coreless build-up wiring board that includes a wiring layer 10, an insulating layer 20, a wiring layer 30, an insulating layer 40, a wiring layer 50, and a solder resist layer 60.

According to this embodiment, the solder resist layer 60 side of the wiring board 1 is conveniently referred to as "upper side" or "first side" and the insulating layer 20 side of the wiring board 1 is conveniently referred to as "lower side" or "second side." Furthermore, with respect to a part or element of the wiring board 1, a surface on the solder resist layer 60 side is conveniently referred to as "first surface" or "upper surface" and a surface on the insulating layer 20 side is conveniently referred to as "second surface" or "lower surface." The wiring board 1, however, may be used in an upside-down position or oriented at any angle. Furthermore, a plan view refers to a view of an object taken in a direction normal to the first surface of the solder resist layer 60, and a planar shape refers to the shape of an object viewed in a direction normal to the first surface of the solder resist layer 60.

According to the wiring board 1, the wiring layer 10 is buried in the insulating layer 20. To be more specific, the upper surface and side surfaces of the wiring layer 10 are covered with the insulating layer 20, and the lower surface of the wiring layer 10 is exposed to the outside. The lower surface of the wiring layer 10 serves as pads for connecting to another wiring board or a semiconductor package. The wiring layer 10, however, may include wiring patterns in addition to the pads. Examples of the material of the wiring layer 10 include copper (Cu). The thickness of the wiring layer 10 may be, for example, approximately 5 µm to approximately 70 µm.

The insulating layer 20 is formed so as to cover the wiring layer 10. Examples of the material of the insulating layer 20 include insulating epoxy resins. The insulating layer 20 may contain a filler such as silica ($SiO_2$). The thickness of the insulating layer 20 may be, for example, approximately 15 µm to approximately 50 µm.

The wiring layer 30 is formed on the insulating layer 20. The wiring layer 30 includes via interconnects that fill in via holes 20x. The via holes 20x are formed through the insulating layer 20 to expose the upper surface of the wiring layer 10. The wiring layer 30 further includes wiring patterns formed on the upper surface of the insulating layer 20. Each via hole 20x has an upper-side opening that is open on the insulating layer 40 side and a lower-side opening that is open on the upper surface of the wiring layer 10. The diameter of the upper-side opening is greater than the diameter of the lower-side opening. Thus, the via holes 20x are depressions having the shape of an inverted truncated cone.

The wiring layer 30 is electrically connected to the wiring layer 10 exposed at the bottom of the via holes 20x. Examples of the material of the wiring layer 30 include copper (Cu). The thickness of wiring patterns forming the wiring layer 30 may be, for example, approximately 5 μm to approximately 70 μm.

The insulating layer 40 is formed on the insulating layer 20 so as to cover the wiring layer 30. Examples of the material of the insulating layer 40 include insulating epoxy resins. The insulating layer 40 may contain a filler such as silica ($SiO_2$). The thickness of the insulating layer 40 may be, for example, approximately 15 μm to approximately 40 μm.

The wiring layer 50 is formed on the insulating layer 40. The wiring layer 50 includes via interconnects that fill in via holes 40x. The via holes 40x are formed through the insulating layer 40 to expose the upper surface of the wiring layer 30. The wiring layer 50 further includes wiring patterns formed on the upper surface of the insulating layer 40. Each via hole 40x has an upper-side opening that is open on the solder resist layer 60 side and a lower-side opening that is open on the upper surface of the wiring layer 30. The diameter of the upper-side opening is greater than the diameter of the lower-side opening. Thus, the via holes 40x are depressions having the shape of an inverted truncated cone.

The wiring layer 50 is electrically connected to the wiring layer 30 exposed at the bottom of the via holes 40x. Examples of the material of the wiring layer 50 include copper (Cu). The thickness of wiring patterns forming the wiring layer 50 may be, for example, approximately 5 μm to approximately 30 μm.

The wiring layer 50 includes portions that serve as pads (hereinafter, "pad portions") and portions that serve as wiring patterns. Referring to FIG. 1B, a stepped recess 5 including a first depression 51 and a second depression 52 is formed on an upper surface 50a of the wiring layer 50 in a pad portion. Specifically, the upper surface 50a of the wiring layer 50 in the pad portion is depressed to form the first depression 51, and the bottom surface of the first depression 51 is further depressed to form the second depression 52. That is, the bottom surface of the second depression 52 is smaller in area than the bottom surface of the first depression 51, and is positioned deeper than the undepressed portion of the bottom surface of the first depression 51. The planar shapes of the pad portion of the wiring layer 50, the first depression 51, and the second depression 52 may be, for example, substantially concentric circles. The first depression 51 and the second depression 52 form, for example, a stepped inner wall surface 50b of the pad portion.

For example, when the diameter of the pad portion of the wiring layer 50 is 50 μm, the diameter of the first depression 51 may be approximately 30 μm, and the diameter of the second depression 52 may be approximately 20 μm. The depth of the first depression 51 relative to the upper surface 50a of the wiring layer 50 may be, for example, approximately 2 μm to approximately 3 μm. The depth of the second depression 52 relative to the upper surface 50a of the wiring layer 50 may be, for example, approximately 4 μm to approximately 6 μm.

The solder resist layer 60 is an insulating layer formed on the upper surface of the insulating layer 40 so as to cover the wiring layer 50. The solder resist layer 60 has, for example, circular openings 60x. In the following description, for the sake of convenience, the openings 60x may be collectively referred to as "opening 60x" where the description is applicable to each of the openings 60x.

Referring to FIG. 1B, part of the second depression 52 of the wiring layer 50 is exposed at the bottom of the illustrated opening 60x. That is, the diameter of the opening 60x is designed to be smaller than the diameter (of the bottom surface) of the second depression 52, and the solder resist layer 60 covers an outer edge portion 51a of the bottom surface and an inner wall surface 51b of the first depression 51 and covers an outer edge portion 52a of the bottom surface and an inner wall surface 52b of the second depression 52. Furthermore, a region 52c of the bottom surface of the second depression 52 inside the outer edge portion 52a is exposed in the opening 60x. A metal layer 70 is formed on the region 52c inside the outer edge portion 52a of the bottom surface of the second depression 52 (in the opening 60x). For example, when the diameter of the first depression 51 is approximately 30 μm and the diameter of the second depression 52 is approximately 20 μm, the diameter of the opening 60x may be approximately 10 μm. According to this embodiment, the bottom surface of the second depression 52 refers to the outer edge portion 52a and the region 52c of the second depression 52, and the bottom surface of the first depression 51 refers to the outer edge portion 51a of the first depression 51 and the bottom surface of the second depression 52. On the other hand, the depth of the first depression 51 refers to the depth of the outer edge portion 51a, and the depth of the second depression 52 refers to the depth of the bottom surface of the second depression 52.

The wiring layer 50 (the bottom surface of the second depression 52) exposed in the opening 60x serves as a pad that is electrically connected to a semiconductor chip. Examples of the material of the solder resist layer 60 include both photosensitive and non-photosensitive insulating epoxy resins. The thickness of the solder resist layer 60 may be, for example, approximately 15 μm to approximately 35 μm.

The pad portions of the wiring layer 50 may be placed either at positions immediately above the via holes 40x (via interconnects) or in areas other than the positions immediately above the via holes 40x (via interconnects). That is, a wiring pattern may be extended from the wiring layer 50 on the insulating layer 40, and the wiring pattern extended on the insulating layer 40 may be exposed in one of the openings 60x to serve as a pad portion. In other words, the recesses 5 (the first and second depressions 51 and 52) may include a recess that is formed at a position over (immediately above) a via interconnect of the wiring layer 50 in a plan view and a recess that is formed at a position that is not over a via interconnect of the wiring layer 50 in a plan view.

Referring to FIG. 1B, the metal layer 70 is formed on the upper surface of the wiring layer 50 (the bottom surface of the second depression 52) exposed in the opening 60x. Examples of the metal layer 70 include a Au layer, a Ni/Au layer (a metal layer in which a Ni layer and a Au layer are stacked in this order), and a Ni/Pd/Au layer (a metal layer in which a Ni layer, a Pd layer, and a Au layer are stacked in this order). The thickness of the metal layer 70 may be, for example, approximately 5 μm.

According to the wiring board 1, an upper surface 70a of the metal layer 70 exposed in the opening 60x is formed at a position lower than the upper surface 50a of the wiring layer 50.

Referring to FIG. 1B, a solder bump 80 is formed on the upper surface 70a of the metal layer 70 exposed in the opening 60x so as to protrude from the upper surface of the solder resist layer 60. Examples of the material of the solder bump 80 include alloys containing Pb, Sn—Cu alloys, Sn—Ag alloys, and Sn—Ag—Cu alloys. The solder bump 80 may be optionally provided on the wiring board 1 as needed, such as in the case of connecting the wiring board 1 to a semiconductor chip.

Next, a description is given of a method of manufacturing a wiring board according to the first embodiment. FIGS. 2A through 2M are diagrams illustrating a method of manufacturing a wiring board according to the first embodiment. In this embodiment, by way of example, a process is illustrated in which a structure to become multiple wiring boards is formed on a support and is divided into individual wiring boards after removal of the support, while it is also possible to form individual wiring boards on a support and then remove the support.

Figure 2A:
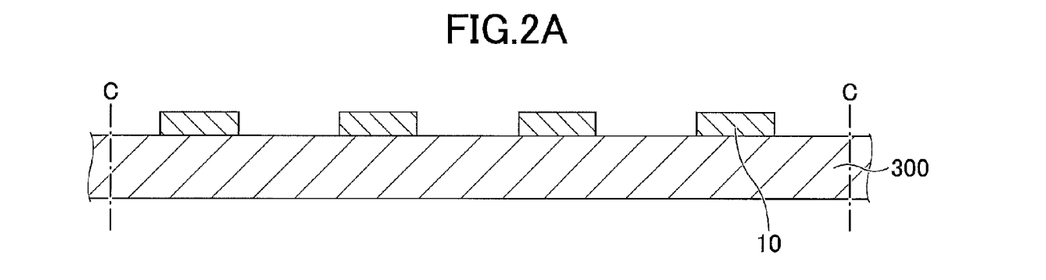
FIGS. 2A through 2M are diagrams illustrating a method of manufacturing a wiring board according to the first embodiment.

First, in the process illustrated in FIG. 2A, a support 300 having a flat upper surface is prepared, and the wiring layer 10 is formed on the upper surface of the support 300. A metal plate or metal foil may be used as the support 300. According to this embodiment, by way of example, copper foil is used as the support 300. The thickness of the support 300 may be, for example, approximately 35 µm to approximately 100 µm.

In order to form the wiring layer 10, first, a resist layer (such as dry film resist) in which openings are formed where the wiring layer 10 is to be formed is formed on the upper surface of the support 300. Then, the wiring layer 10 is formed on the upper surface of the support 300 exposed in the openings of the resist layer by a process such as electroplating using the support 300 as a plating power feeding layer. Thereafter, the resist layer is removed. The material and the thickness of the wiring layer 10 are as described above.

Figure 2B:
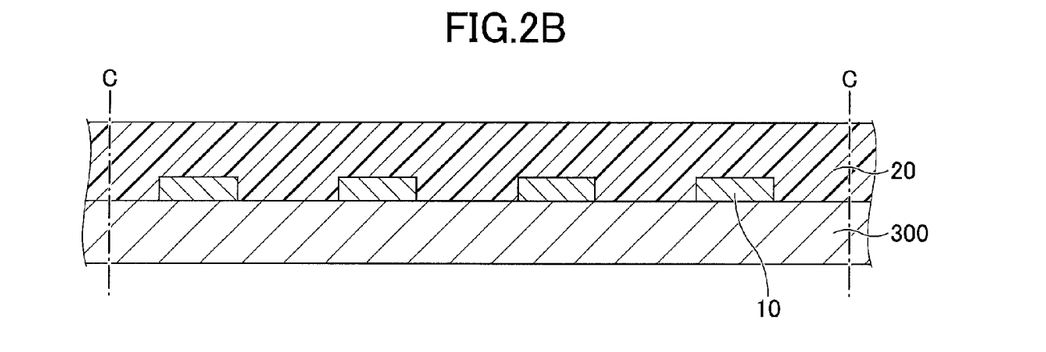

Next, in the process illustrated in FIG. 2B, for example, thermosetting insulating epoxy resin or the like in film form is applied to laminate the upper surface of the support 300, or thermosetting insulating epoxy resin or the like in liquid or paste form is applied on the upper surface of the support 300 by a process such as spin coating, so as to cover the upper surface and side surfaces of the wiring layer 10. Then, the applied insulating resin is heated to above a curing temperature so as to be hardened while being pressed, so that the insulating layer 20 is formed. The material and the thickness of the insulating layer 20 are as described above.

Figure 2C:
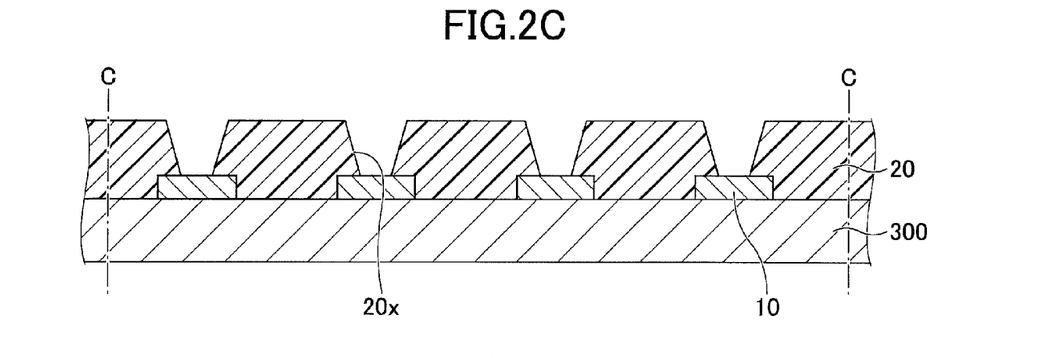

Next, in the process illustrated in FIG. 2C, the via holes 20x are formed through the insulating layer 20 so as to expose the upper surface of the wiring layer 10. The via holes 20x may be formed by, for example, laser processing using a $CO_2$ laser. The via holes 20x formed by laser processing are depressions having the shape of an inverted truncated cone with the upper-side opening being greater in diameter than the lower-side opening that is open on the upper surface of the wiring layer 10. In the case of forming the via holes 20x by laser processing, it is preferable to perform a desmear process to remove the residual resin of the insulating layer 20 adhering to the upper surface of the wiring layer 10 exposed at the bottom of the via holes 20x.

Figure 2D:
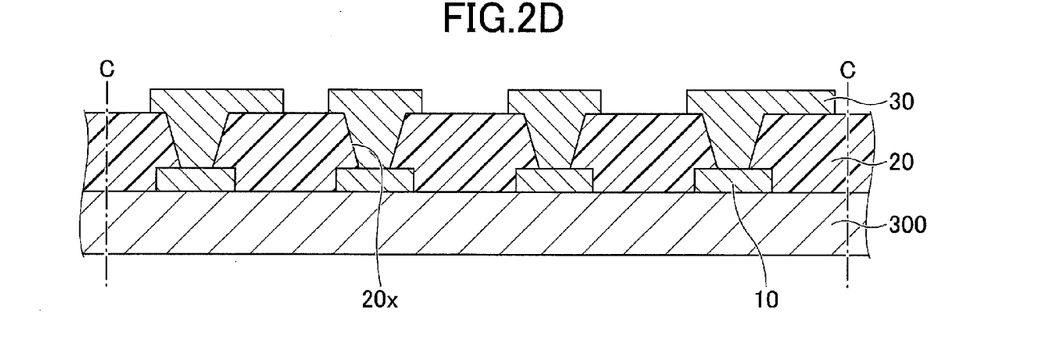

Next, in the process illustrated in FIG. 2D, the wiring layer 30 is formed on the insulating layer 20. The wiring layer 30 includes via interconnects that fill in the via holes 20x and wiring patterns formed on the upper surface of the insulating layer 20. The wiring layer 30 is electrically connected to the wiring layer 10 exposed at the bottom of the via holes 20x. The material and the thickness of the wiring layer 30 are as described above. Various kinds of wiring layer forming methods, such as a semi-additive process and a subtractive process, are usable in forming the wiring layer 30.

Figure 2E:
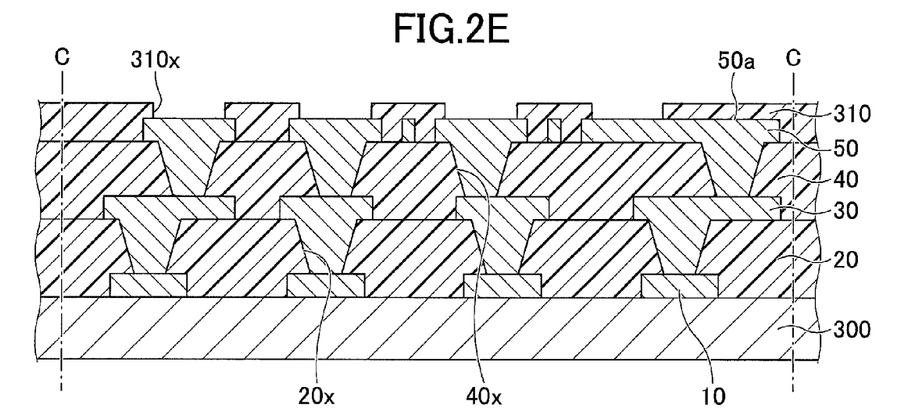

Next, in the process illustrated in FIG. 2E, first, the same processes as illustrated in FIGS. 2B through 2D are performed. That is, the insulating layer 40 and the wiring layer 50 are stacked on the wiring layer 30, and the wiring layer 50 and the wiring layer 30 are connected via the via holes 40x. Thereafter, a resist layer 310 having openings 310x that selectively expose part of the upper surface 50a of the wiring layer 50 is formed on the insulating layer 40. Specifically, the insulating layer 40 is laminated with, for example, dry film resist serving as the resist layer 310.

The resist layer 310 is provided so as to form the first depressions 51. Therefore, the planar shape of the openings 310x is conformed to a desired planar shape of the first depressions 51. For example, when the first depressions 51 have a circular planar shape, the openings 310x also have a circular planar shape. For example, when the diameter of the pad portions of the wiring layer 50 is 50 µm, the diameter of the first depressions 51 may be approximately 30 µm.

Figure 2F:
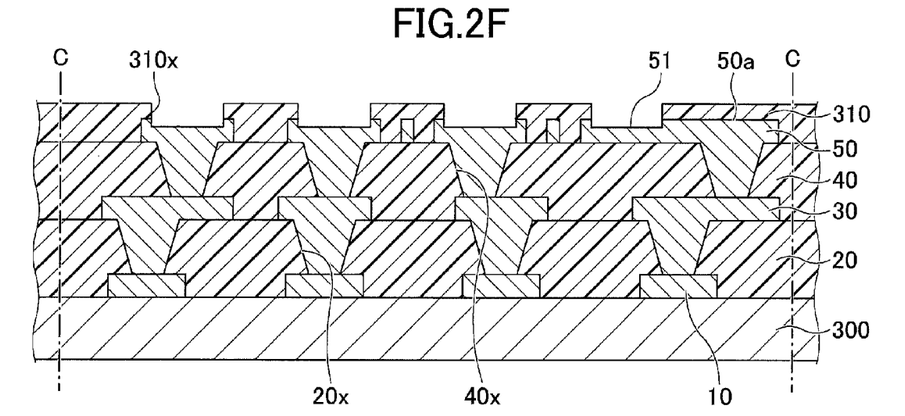

Next, in the process illustrated in FIG. 2F, the upper surface 50a of the wiring layer 50 exposed in the openings 310x is etched so as to form the first depressions 51. When the wiring layer 50 is formed of copper (Cu), the first depressions 51 may be formed by, for example, wet etching using a ferric chloride aqueous solution, a cupric chloride aqueous solution, an ammonium persulfate aqueous solution or the like. The depth of the first depressions 51 relative to the upper surface 50a of the wiring layer 50 may be, for example, approximately 2 µm to approximately 3 µm.

Figure 2G:
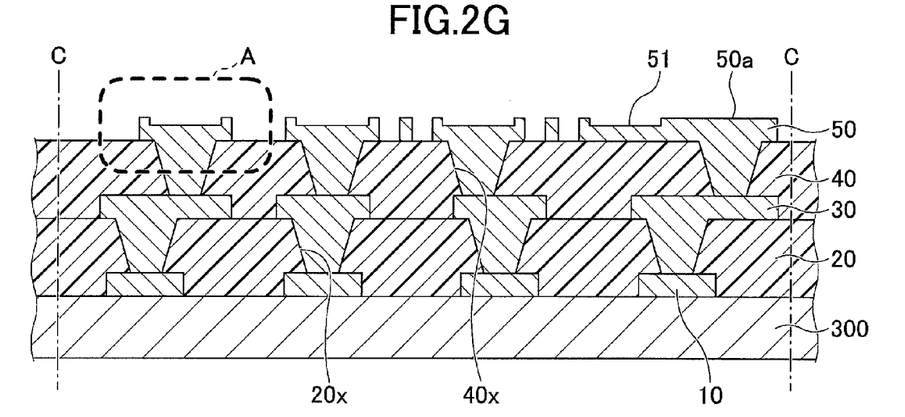

Next, in the process illustrated in FIG. 2G, the resist layer 310 illustrated in FIG. 2F is removed. As a result, the wiring layer 50 including the first depressions 51 are exposed on the insulating layer 40. The following processes are described with reference to enlarged views of part of FIG. 2F indicated by A.

Figure 2H:
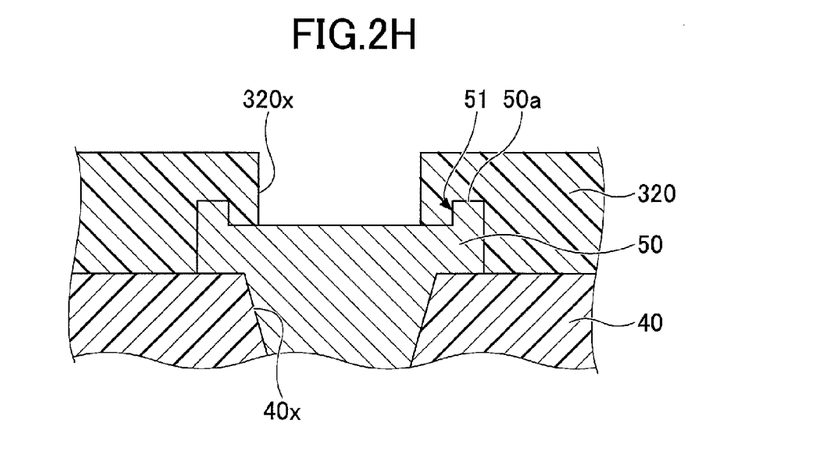

Next, in the process illustrated in FIG. 2H, a resist layer 320 having an opening 320x that selectively exposes part of the upper surface 50a of the wiring layer 50 is formed on the insulating layer 40. Specifically, the insulating layer 40 is laminated with, for example, dry film resist serving as the resist layer 320.

The resist layer 320 is provided so as to form the second depression 52. Therefore, the planar shape and the position of the opening 320x are conformed to a desired planar shape and position of the second depression 52. For example, the second depression 52 may have a circular shape smaller in diameter than the first depression 51 and substantially concentric with the first depression 51. In this case, the opening 320x has a circular planar shape. For example, when the diameter of the first depression 51 is approximately 30 µm, the diameter of the second depression 52 may be approximately 20 µm.

Figure 2I:
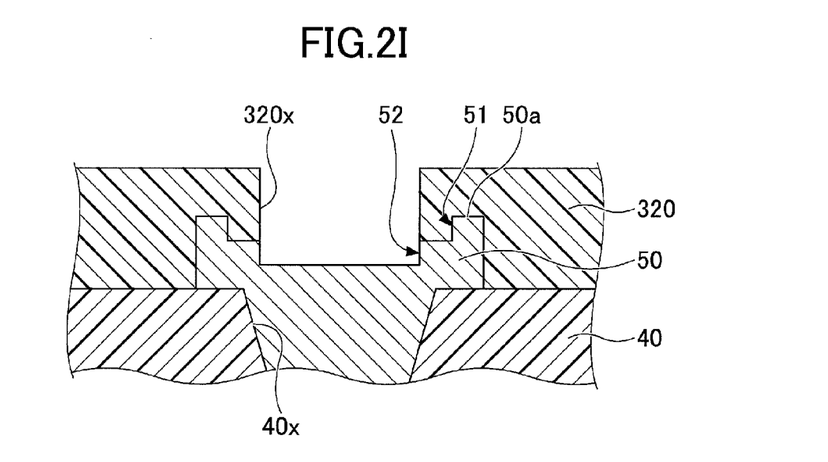

Next, in the process illustrated in FIG. 2I, the bottom surface of the first depression 51 exposed in the opening 320x is etched so as to form the second depression 52. When the wiring layer 50 is formed of copper (Cu), the second depression 52 may be formed by, for example, the same wet etching as for the first depression 51. The depth of the second depression 52 relative to the undepressed portion (the outer edge portion 51a) of the bottom surface of the first depression 51 may be, for example, approximately 2 µm to approximately 3 µm. The depth of the second depression 52 relative to the upper surface 50a of the wiring layer 50 may be, for example, approximately 4 µm to approximately 6 µm.

Figure 2J:
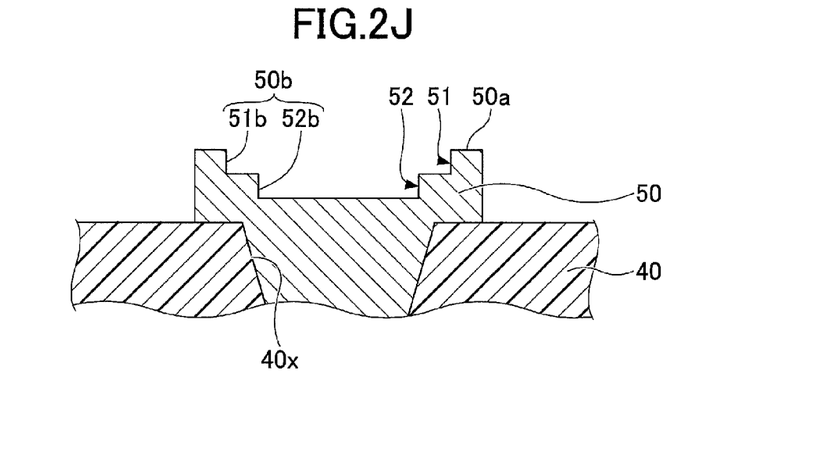

Next, in the process illustrated in FIG. 2J, the resist layer 320 illustrated in FIG. 2I is removed. As a result, the wiring layer 50 including the first depression 51 and the second depression 52 is exposed on the wiring layer 40. The planar shapes of the first depression 51 and the second depression 52 are, for example, substantially concentric circles. The first depression 51 and the second depression 52 form, for example, the stepped inner wall surface 50b.

Figure 2K:
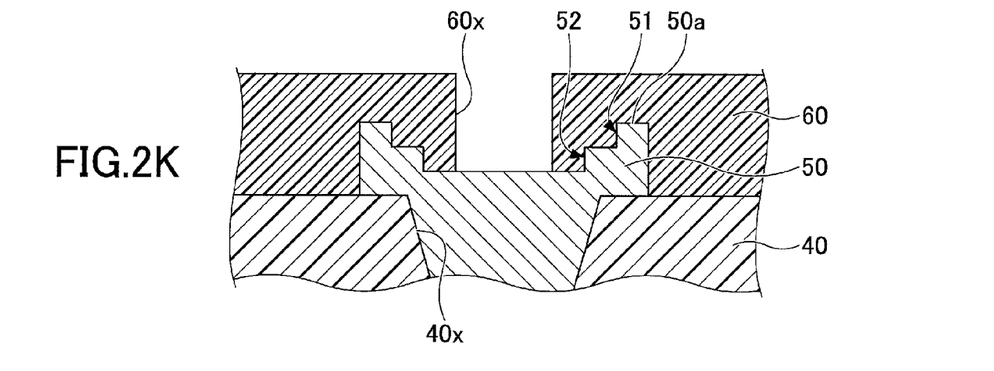

Next, in the process illustrated in FIG. 2K, the solder resist layer 60 is formed on the insulating layer 40 so as to cover the wiring layer 50. The solder resist layer 60 may be formed by, for example, applying photosensitive insulating epoxy resin or the like in liquid or paste form on the insulating layer 40 by a process such as screen printing, roll coating, or spin coating, so that the wiring layer 50 is covered with the photosensitive insulating epoxy resin. Alternatively, the solder resist layer 60 may be formed by, for example, applying photosensitive insulating epoxy resin or the like in film form as a laminate on the insulating layer 40, so that the wiring layer 50 is covered with the photosensitive insulating epoxy resin.

Then, the opening 60x is formed by exposing to light and developing the applied insulating resin (photolithography). As a result, the solder resist layer 60 having the opening 60x is formed. Alternatively, a film of insulating resin in which the opening 60x is pre-formed may be applied as a laminate on the insulating layer 40 so as to cover the wiring layer 50.

As the material of the solder resist layer 60, non-photosensitive insulating resin may also be used. In this case, after forming and hardening the solder resist layer 60 on the insulating layer 40, the opening 60x may be formed by, for example, laser processing using a $CO_2$ laser or blasting using an abrasive such as abrasive grains.

The planar shape of the opening 60x is, for example, a circle that is smaller in diameter than the planar shape of the second depression 52. Part of the second depression 52 of the wiring layer 50 is exposed at the bottom of the opening 60x. That is, the diameter of the opening 60x is designed to be smaller than the diameter of the second depression 52, and the solder resist layer 60 covers the stepped part (stepped inner wall surface 50b) formed by the first depression 51 and the second depression 52. For example, when the diameter of the first depression 51 is approximately 30 μm and the diameter of the second depression 52 is approximately 20 μm, the diameter of the opening 60x may be approximately 10 μm.

Roughening the surface of the wiring layer 50 before formation of the solder resist layer 60 increases the adhesion between the wiring layer 50 and the solder resist layer 60, and accordingly, is preferable. Roughening may be performed by, for example, wet etching using a formic acid.

Figure 2L:
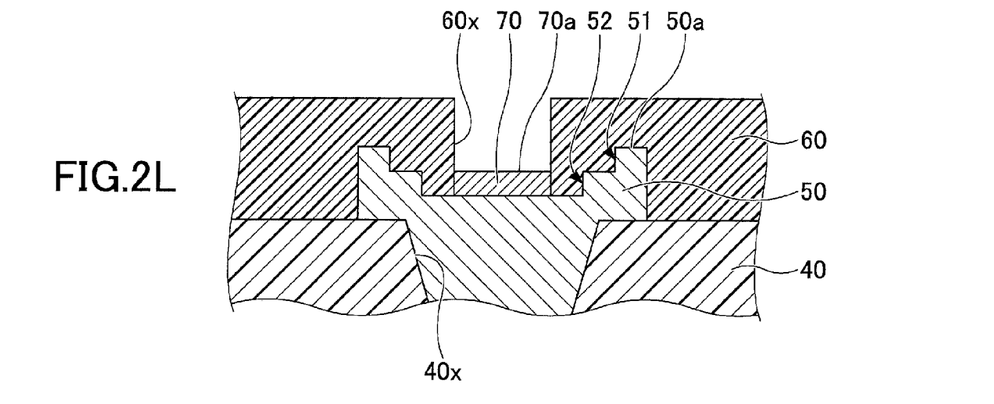

Next, in the process illustrated in FIG. 2L, the metal layer 70 is formed on a surface of the wiring layer 50 (the bottom surface of the second depression 52) exposed in the opening 60x by, for example, electroless plating. The material and the thickness of the metal layer 70 are as described above. The metal layer 70 is formed so that the upper surface 70a of the metal layer 70 is lower than the upper surface 50a of the wiring layer 50. It is preferable to activate a surface of the wiring layer 50 (the bottom surface of the second depression 52) exposed in the opening 60x by a process such as plasma processing before formation of the metal layer 70.

Figure 2M:
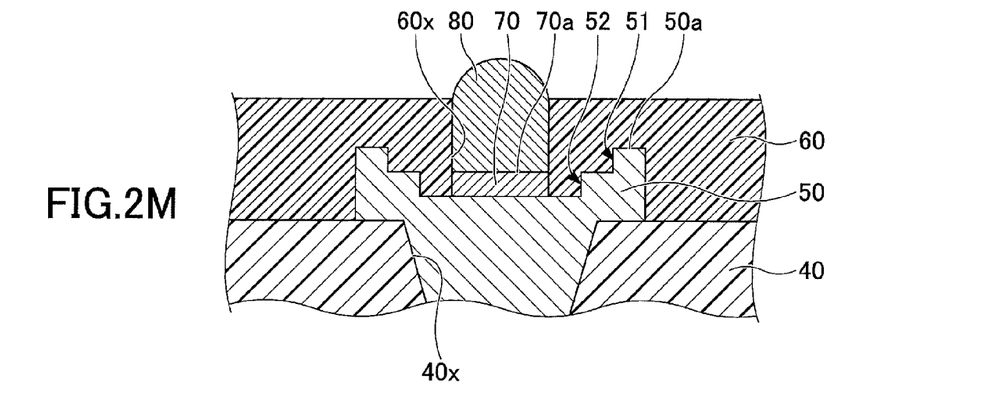

Next, in the process illustrated in FIG. 2M, the solder bump 80 is formed on the upper surface 70a of the metal layer 70 exposed in the opening 60x by a process such as reflow soldering, so as to protrude from the upper surface of the solder resist layer 60. The material of the solder bump 80 is as described above.

After the process illustrated in FIG. 2M, the support 300 illustrated in FIG. 2G is removed, and the remaining structure is cut at cutting positions indicated by C in FIG. 2G with a slicer or the like into individual pieces, so that multiple wiring boards 1 (see FIGS. 1A and 1B) are completed. The support 300, which is copper foil, may be removed with the same etchant as used in the process illustrated in FIG. 2F. The process of FIG. 2H and the subsequent processes may be performed after removal of the support 300.

Here, a description is given, with reference to a comparative example, of effects specific to the wiring board 1.

Figure 3:
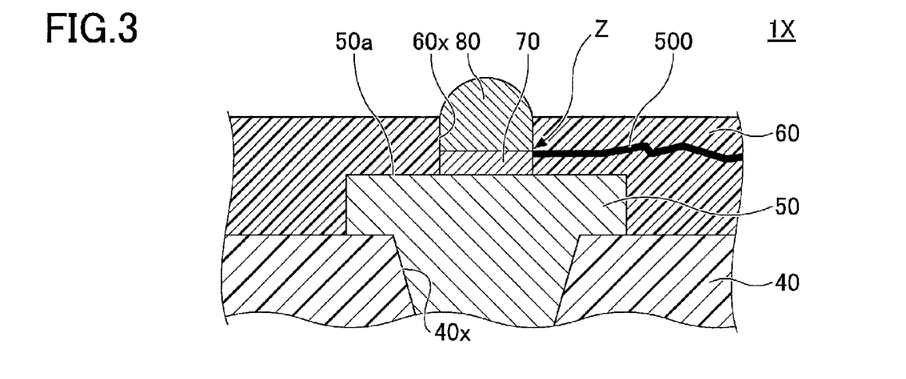
FIG. 3 is a cross-sectional view of a wiring board according to a comparative example.

FIG. 3 is a cross-sectional view of a wiring board according to the comparative example. Referring to FIG. 3, a wiring board 1X according to the comparative example is different from the wiring board 1 (see FIGS. 1A and 1B) in that the wiring layer 50 does not have the first depression 51 and the second depression 52.

That is, according to the wiring board 1X, the upper surface 50a of the wiring layer 50 is a flat surface, on which the metal layer 70 is formed. As described above, in the case of forming a semiconductor package by mounting a semiconductor chip on the wiring board 1X, a crack 500 may be generated in the solder resist layer 60, starting from an interface Z between the metal layer 70 and the solder bump 80, because of a difference in the coefficient of thermal expansion between the wiring board 1X and the semiconductor chip.

The wiring board 1X has no structure to prevent extension of the crack 500, which is normally likely to extend laterally (in a direction parallel to the upper surface of the insulating layer 40). Therefore, once the crack 500 is generated, the crack 500 is likely to increase in size. As a result, problems such as delamination of the solder resist layer 60 and a short circuit in the wiring layer 50 due to entry of solder into the crack 500 may be caused.

On the other hand, according to the wiring board 1, the upper surface 70a of the metal layer 70 is lower than the upper surface 50a of the wiring layer 50. Therefore, even when a crack starting from the interface Z between the metal layer 70 and the solder bump 80 is generated so as to laterally extend, the crack collides with and is stopped by the peripheral wall of the first depression 51 and the second depression 52 (a portion of the wiring layer 50 surrounding the first depression 51 and the second depression 52) so as to be prevented from extending further. That is, the peripheral wall of the first depression 51 and the second depression 52 serves as a structure to stop extension of the crack. Therefore, even when a crack is generated, it is possible to reduce the likelihood that the crack causes delamination of the solder resist layer 60 or a short circuit in the wiring layer 50.

Furthermore, according to the wiring board 1, the first depression 51 and the second depression 52 are formed on the upper surface 50a of the wiring layer 50. Furthermore, the solder resist layer 60 covers the outer edge portion 51a of the bottom surface and the inner wall surface 51b of the first depression 51 and covers the outer edge portion 52a of the bottom surface and the inner wall surface 52b of the second depression 52. Therefore, compared with the wiring board 1X, the contact area of the solder resist layer 60 and the wiring layer 50 increases, so that the adhesion between the solder resist layer 60 and the wiring layer 50 is significantly improved. According to the wiring board 1, this effect also serves to prevent delamination of the solder resist layer 60.

Thus, according to the wiring board 1, it is possible to reduce a decrease in reliability due to a crack generated in the solder resist layer 60 that is an insulating layer.

[b] Second Embodiment

In a second embodiment, a semiconductor package in which a semiconductor chip is mounted (by flip-chip mounting) on a wiring board according to the first embodiment is illustrated. In the second embodiment, a description of the same configurations as those of the above-described embodiment may be omitted.

Figure 4A:
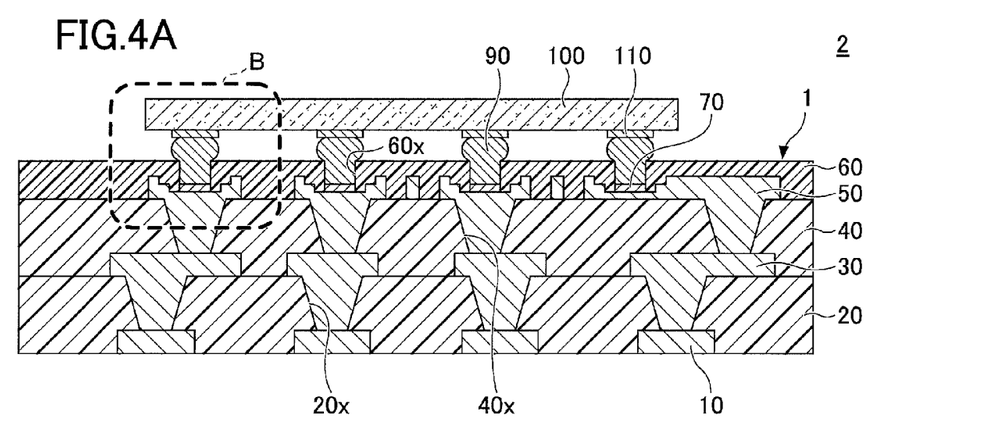
FIGS. 4A and 4B are cross-sectional views of a semiconductor package according to a second embodiment.
Figure 4B:
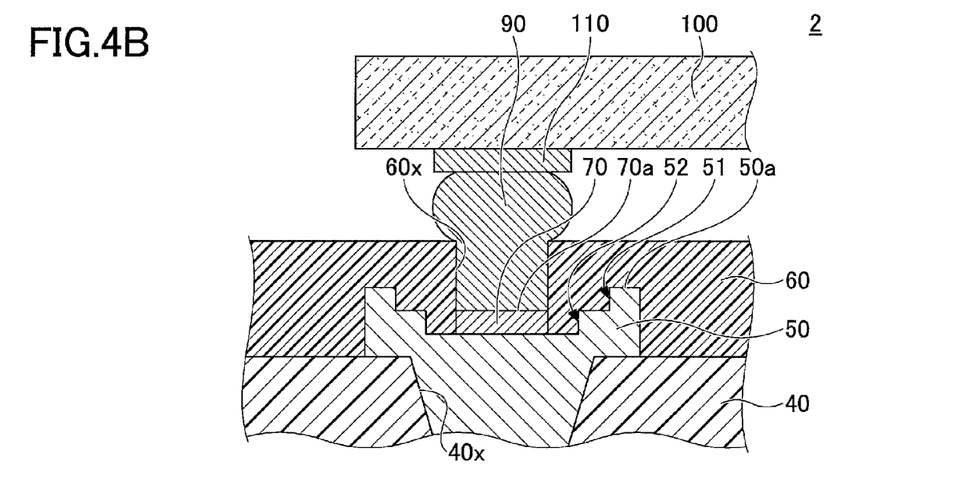

FIGS. 4A and 4B are cross-sectional views of a semiconductor package 2 according to the second embodiment. FIG. 4B is an enlarged view of part of FIG. 4A indicated by B. Referring to FIGS. 4A and 4B, according to the semiconductor package 2, a semiconductor chip 100 is mounted on the wiring board 1 illustrated in FIGS. 1A and 1B via bumps 90 by flip-chip mounting.

The semiconductor chip 100 includes, for example, a thinned semiconductor substrate (not graphically represented) formed of silicon or the like and a semiconductor integrated circuit (not graphically represented) formed on the semiconductor substrate. Electrode pads 110 electrically connected to the semiconductor integrated circuit are formed on the semiconductor substrate.

Referring to FIG. 4B, the solder bump 90 joins the electrode pad 110 of the semiconductor chip 100 and the metal layer 70 exposed in the opening 60x of the solder resist layer 60 of the wiring board 1. The space between the semiconductor chip 100 and the wiring board 1 may be filled with underfill resin.

The solder bump 80 of the wiring board 1 and a solder bump formed on the electrode pad 110 of the semiconductor chip 100 melt to be alloyed into the solder bump 90. Examples of the material of the solder bump 90 include alloys containing Pb, Sn—Cu alloys, Sn—Ag alloys, and Sn—Ag—Cu alloys.

Thus, it is possible to produce the semiconductor package 2 by mounting the semiconductor chip 100 on the wiring board 1 according to the first embodiment.

As described above, a crack may be generated in the semiconductor package 2, starting from the interface between the metal layer 70 and the solder bump 90, because of a difference in the coefficient of thermal expansion between the wiring board 1 and the semiconductor chip 100. According to the wiring board 1, however, the peripheral wall of the first depression 51 and the second depression 52 formed in the wiring layer 50 serves as a structure to stop extension of the crack. Therefore, it is possible to reduce the likelihood that the crack causes delamination of the solder resist layer 60 or a short circuit in the wiring layer 50. Furthermore, according to the wiring board 1, the contact area of the solder resist layer 60 and the wiring layer 50 increases compared with conventional wiring boards, so that it is possible to prevent delamination of the solder resist layer 60. As a result, the reliability of the semiconductor package 2 is improved.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. A wiring board and a semiconductor package are described above based on embodiments of the present invention. It should be understood, however, that the various changes, substitutions, and alterations could be made hereto without departing from the spirit and scope of the invention.

For example, while a recess is formed in a pad portion on the semiconductor chip mounting side (the wiring layer 50) according to the above-described embodiments, it is also possible to form a recess in a pad portion on the side opposite to the semiconductor chip mounting side (the lower surface of the wiring layer 10). This is because the same effects as described above are produced in the case of forming a solder resist layer and a metal layer in a pad portion on the side opposite to the semiconductor chip mounting side (the lower surface of the wiring layer 10). It is also possible to form a recess in both a pad portion on the semiconductor chip mounting side (the wiring layer 50) and a pad portion on the side opposite to the semiconductor chip mounting side (the lower surface of the wiring layer 10).

Furthermore, while the above-described embodiments are described taking a coreless build-up wiring board as an example, the present invention may be applied to any wiring board that includes a pad and an insulating layer having an opening that exposes the pad.

Furthermore, the first depression 51 and the second depression 52 may be eccentric to a pad portion of the wiring layer 50 in a plan view. For example, when the distance from the pad portion to a wiring pattern is short on one side and long on the other side of the pad portion in the wiring layer 50, the center of the first depression 51 and the second depression 52 may be offset to the other side of the pad portion relative to the center of the pad portion. This is because the reliability of the wiring board 1 is further improved by ensuring a distance between the starting point of a crack and each wiring pattern.

Furthermore, the recess 5 may be formed of a single depression if the upper surface 70a of the metal layer 70 is lower than the upper surface 50a of the wiring layer 50. This is because even in the case of a single depression, the contact area of the solder resist layer 60 and the wiring layer 50 increases to improve their adhesion, and it is possible to prevent extension of a crack when the upper surface 70a of the metal layer 70 is lower than the upper surface 50a of the wiring layer 50. Alternatively, the recess 5 may include three or more depressions. In this case, the contact area of the solder resist layer 60 and the wiring layer 50 further increases to further improve their adhesion.

Furthermore, when the upper surface 70a of the metal layer 70 is lower than the upper surface 50a of the wiring layer 50, the solder resist layer 60 does not have to cover the outer edge portion 51a of the bottom surface or the inner wall surface 51b of the first depression 51, or the outer edge portion 52a of the bottom surface or the inner wall surface 52b of the second depression 52. That is, the metal layer 70 may be formed on the entire bottom surface of the second depression 52 or on the entire bottom surface of the first depression 51 and the second depression 52. In this case, however, while the crack extension stopping effect is produced, the effect due to an increase in the contact area of the solder resist layer 60 and the wiring layer 50 is limited or not produced.

What is claimed is:

1. A wiring board, comprising:
  a wiring layer including a surface in which a recess is formed, the recess including a stepped inner wall surface; and
  a metal layer formed on a bottom surface of the recess,
  wherein a surface of the metal layer facing away from the bottom surface of the recess is closer to the bottom surface of the recess than is the surface of the wiring layer.

2. The wiring board as claimed in claim 1, further comprising:
  an insulating layer covering the wiring layer, the insulating layer including an opening formed through the insulating layer so as to expose the bottom surface of the recess,
  wherein the metal layer is formed on the bottom surface of the recess in the opening, and
  wherein the surface of the metal layer facing away from the bottom surface of the recess is exposed in the opening.

3. The wiring board as claimed in claim 2, wherein
  the insulating layer covers an outer edge portion of the bottom surface of the recess and an inner wall surface of the recess, and
  the metal layer is formed on a region of the bottom surface of the recess, the region being inside the outer edge portion and exposed in the opening.

4. The wiring board as claimed in claim 2, wherein
  the recess includes a first depression and a second depression formed in the first depression,
  an area of a bottom surface of the second depression is smaller than an area of a bottom surface of the first depression, and
  the second depression is deeper than the first depression relative to the surface of the wiring layer.

5. The wiring board as claimed in claim 4, wherein
  the insulating layer covers a first outer edge portion of the bottom surface of the first depression, a first inner wall surface of the first depression, a second outer edge portion of the bottom surface of the second depression, and a second inner wall surface of the second depression, and
  the metal layer is formed on a region of the bottom surface of the second depression, the region being inside the second outer edge portion and exposed in the opening.

6. The wiring board as claimed in claim 2, further comprising:
  an additional insulating layer on which the wiring layer is formed; and
  an additional wiring layer covered with the additional insulating layer,
  wherein the wiring layer is connected to the additional wiring layer through via interconnects formed through the additional insulating layer,
  wherein the recess includes a first recess formed in a first portion of the wiring layer connected to a first one of the via interconnects and a second recess formed in a second portion of the wiring layer connected to a second one of the via interconnects, and
  wherein the first recess is formed over the first one of the via interconnects and the second recess is not formed over the second one of the via interconnects in a plan view.

7. The wiring board as claimed in claim 2, wherein the insulating layer is a solder resist layer.

8. The wiring board as claimed in claim 1, wherein the bottom surface of the recess is activated.

9. The wiring board as claimed in claim 1, wherein
  the recess includes a first depression and a second depression formed in the first depression, and
  planar shapes of the first depression and the second depression are substantially concentric circles.

10. A semiconductor package, comprising:
  the wiring board as set forth in claim 1, and
  a semiconductor chip mounted on the wiring board,
  wherein the metal layer and an electrode pad of the semiconductor chip are soldered.

11. A wiring board, comprising:
  a wiring layer including a surface in which a recess is formed, the recess including a stepped inner wall surface; and
  a metal layer formed on a bottom surface of the recess,
  wherein a depth of the recess relative to the surface of the wiring layer is greater than a dimension of the metal layer in a direction of the depth of the recess.

* * * * *